United States Patent [19]

Carpenter

[11] Patent Number: 5,061,902
[45] Date of Patent: Oct. 29, 1991

[54] LINEAR AMPLIFIER
[75] Inventor: Gary D. Carpenter, Lexington, Ky.
[73] Assignee: International Business Machines Corp., Armonk, N.Y.
[21] Appl. No.: 592,412
[22] Filed: Oct. 3, 1990
[51] Int. Cl.[5] .......................... H03F 3/26; H03F 3/16
[52] U.S. Cl. .................................... 330/264; 330/268
[58] Field of Search ................ 330/51, 264, 267, 268, 330/269, 277, 246

[56] References Cited
U.S. PATENT DOCUMENTS
4,015,212 3/1977 Miyata ............................... 330/264

Primary Examiner—Steven Mottola
Attorney, Agent, or Firm—J. J. McArdle; W. H. Steinberg

[57] ABSTRACT

The provision of shoot-through protection with means for producing a low impedance path from the gate of each power transistor to its source conduction electrode if the gate to source voltage at the other transistor is greater than a reference value. This additional circuitry permits the use of a desired driver circuit without modification, while preventing shoot-through whether from the driver signals or from high output voltage changes.

2 Claims, 4 Drawing Sheets

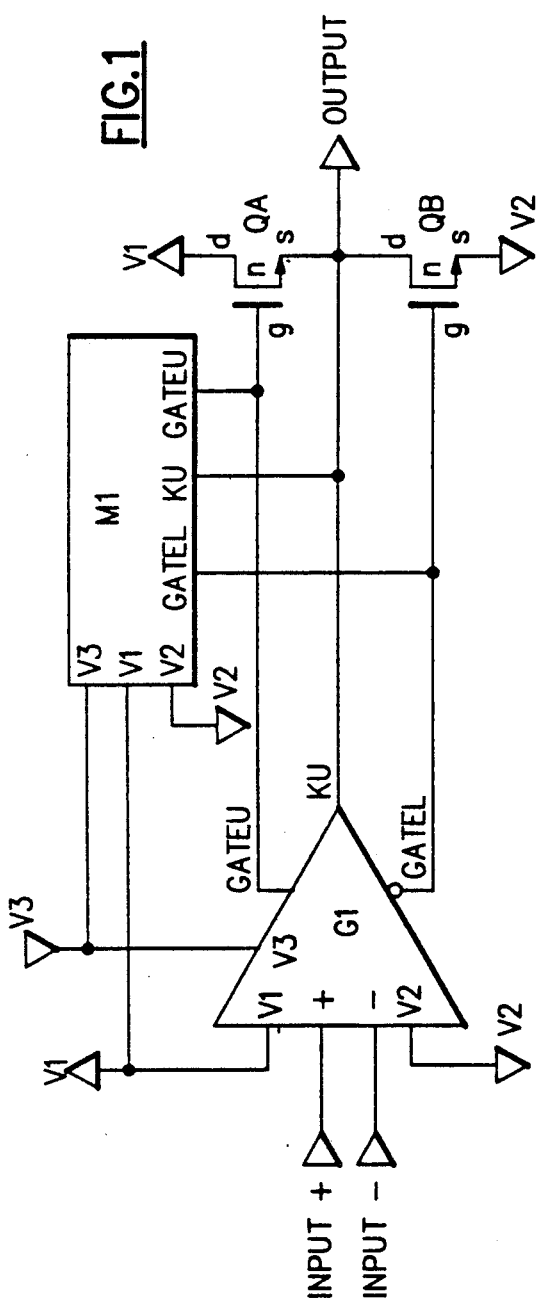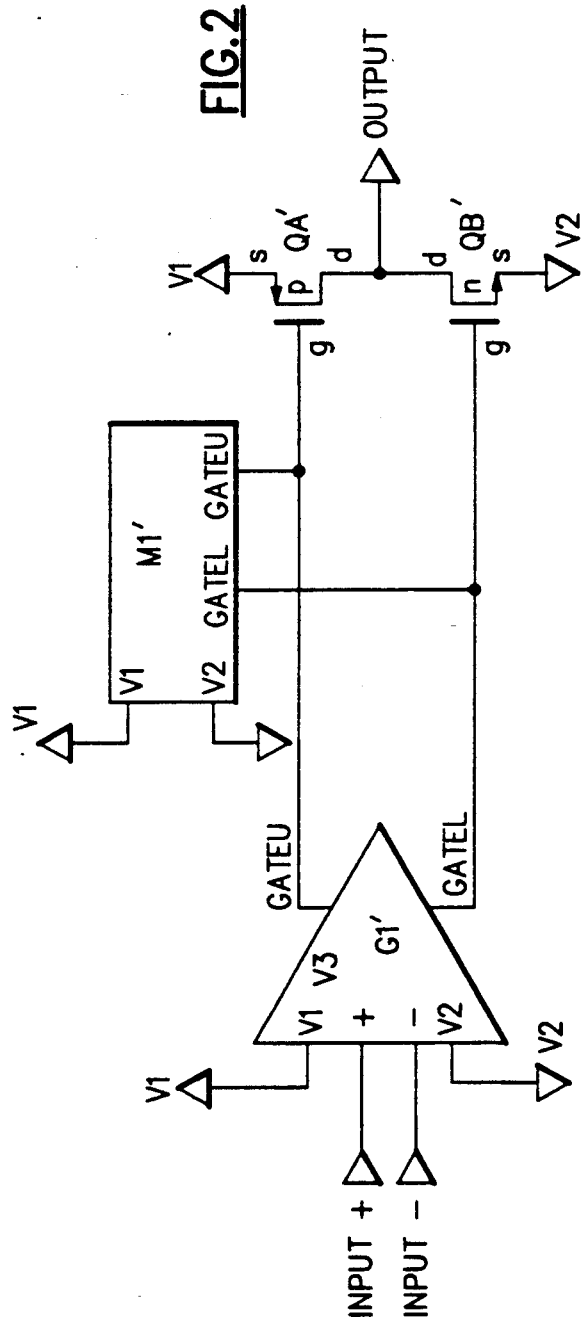

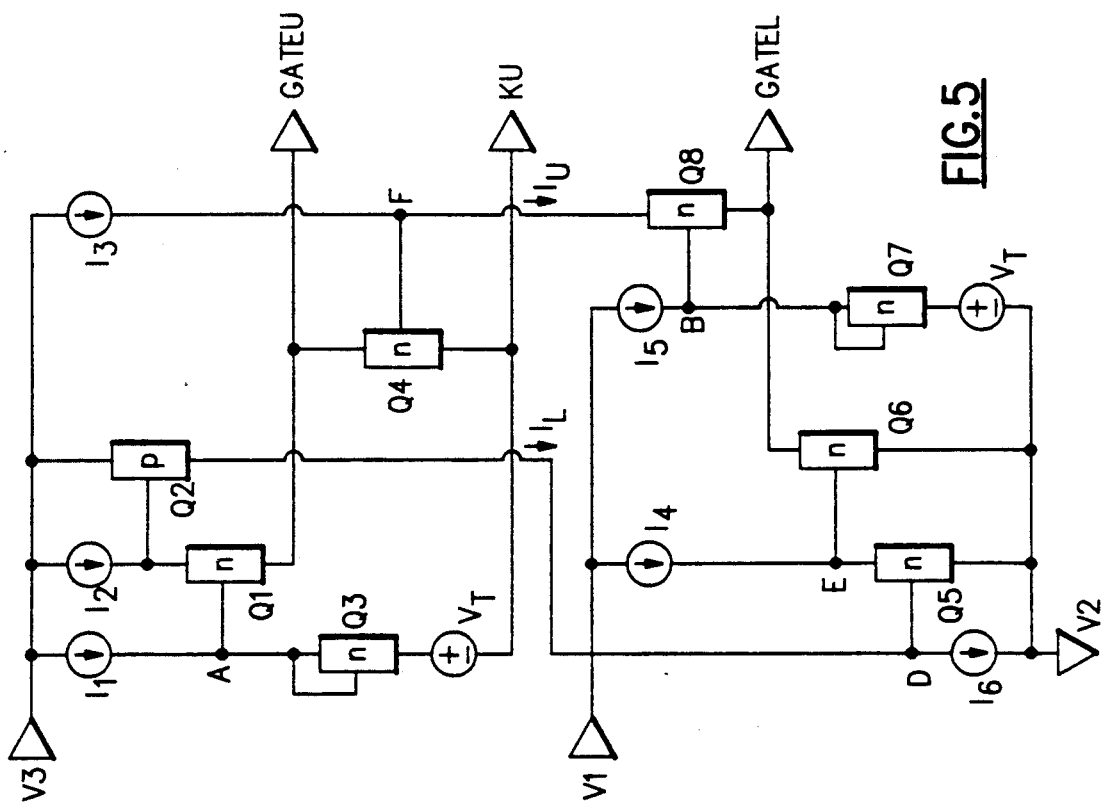
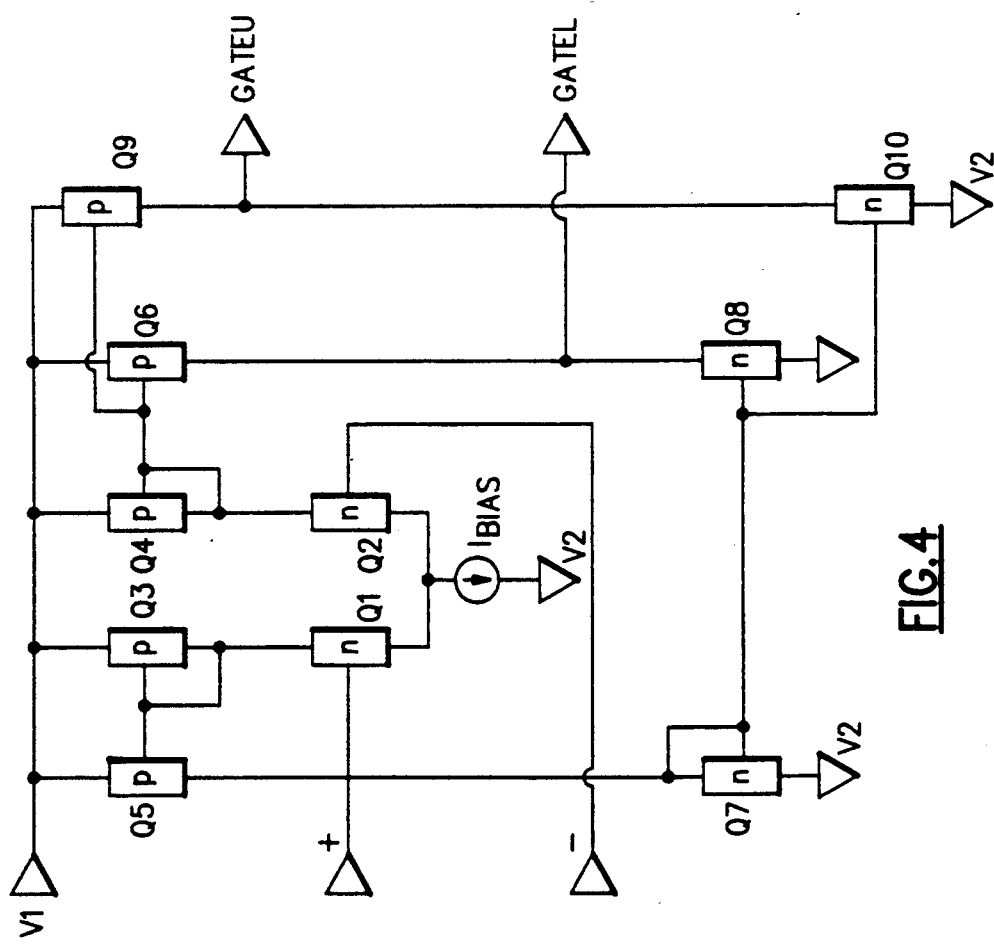
FIG.5
FIG.4

LINEAR AMPLIFIER

FIELD OF THE INVENTION

This invention relates generally to linear power amplifiers and more particularly concerns a form of linear power amplifier which includes shoot-through protection.

BACKGROUND OF THE INVENTION

A linear class AB or B power amplifier requires the use of a high side power transistor and a low side power transistor as the output stage. If standard low power techniques are applied to linearly control and drive the power transistor output stage, the resulting amplifier is subject to the following disadvantages. Low gain and additional compensation components to create a dominant pole for closed loop operation. There can be high shoot-through currents and/or high quiescent power dissipation, which can become worse if operated at high frequencies. Measures typically used to avoid shoot-through currents often produce large amounts of crossover distortion to achieve class B operation.

Among the characteristics of a good class B linear power amplifier are high open loop gain, dominant pole compensation for closed loop applications and a differential input to allow flexibility of interfacing. Further characteristics are controllable slew rate and wide bandwidth, an upper gate driver capable of floating with the source of the upper device if an N-type MOS device is used as the high side output device. It is also necessary to provide protection against shoot-through, where both devices in the linear power amplifier simultaneously conduct, resulting in large supply current transients and power dissipation.

Shoot-through can occur due to overlap in transitioning from one output device to the other in response to input drive signals or due to rapidly changing voltage on the output in combination with Miller capacitance effects on the output devices. It is also desirable to minimize crossover distortion while preventing shoot-through.

The use of a high impedance current source gate drive, circuitry to control the transition of one output device to the other, and a differential input transconductance amplifier for the input stage yields a linear class B amplifier having a number of advantages. These advantages include easy integration of required components, ease of level shifting drive signals through the use of current source gate drive sources, a current source gate drive combining with the input capacitance of a MOS power device providing high gain as well as dominant pole compensation for closed loop operation, which eliminates the need for additional compensation capacitance, and controls slew rate independent of the small signal transfer function by limiting or enhancing the maximum gate drive current under large signal conditions.

In such a linear power amplifier, separate circuits controlling the transition from one output device to the other can take the form of detection of the on/off state of each power device and inhibiting the turn on of the other device allows a simplified single differential input stage for the amplifier. This inhibition of the turn on of the non-conducting device provides shoot-through protection to prevent large supply current spikes and power dissipations during transitions from changing active output devices and under rapidly changing voltage conditions of the output stage.

The advantages reflected in the use of a current source gate drive, such as inherent high gain and dominant pole compensation, using a transconductance amplifier when driving a MOS output stage are described in the co-pending patent application, Ser. No. 07/592,148, entitled "Current Mode Gate Drive for Power MOS Transistors", commonly assigned herewith.

An aspect of the present invention includes the provision of shoot-through protection with means for producing a low impedance path from the gate of each power transistor to its source conduction electrode if the gate to source voltage at the other transistor is greater than a reference value. This additional circuitry permits the use of a desired driver circuit without modification, while preventing shoot-through whether from the driver signals or from high output voltage changes.

BRIEF DESCRIPTION OF THE DRAWINGS

FIG. 1 is a circuit diagram of a class B linear power amplifier with all N type transistors in the output stage;

FIG. 2 is a schematic diagram of a class B linear power amplifier with a complementary output stage;

FIG. 4 is a schematic diagram of a differential input, dual output, transconductance amplifier for the driver of the circuit of FIG. 2;

FIG. 5 is a schematic diagram of an embodiment of the shoot-through protection circuit of FIG. 1;

DETAILED DESCRIPTION

Figure 3:
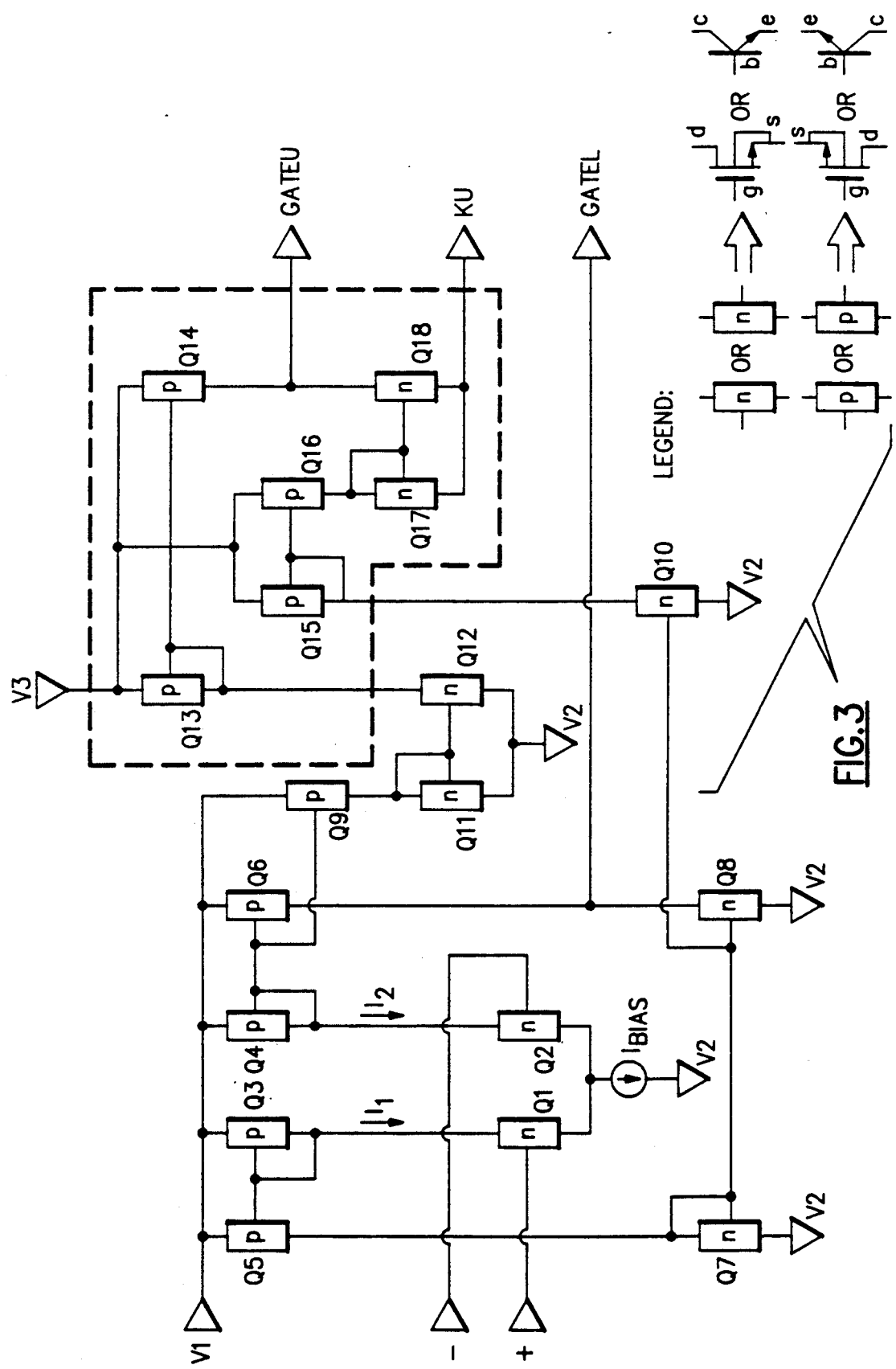
FIG. 3 is a schematic diagram of a differential input transconductance amplifier with floating in-phase output, for the driver of FIG. 1.

While the invention is susceptible to various modifications and alternative forms, a specific embodiment thereof has been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention, as defined by the appended claims.

FIGS. 1 and 2 show two embodiments of a power amplifier in accordance with the invention. Each uses a differential input transconductance amplifier G1, G1'. G1 has a bidirectional complementary output, and G1' has dual bidirectional outputs wired in parallel with a shoot-through prevention circuit M1, M1' to drive a power output stage. In FIG. 1 the transconductance amplifier G drives a power N-type MOS output stage to form a high gain linear class B amplifier. Since the source of the high side field effect transistor QA can swing from ground to V1, the gate driver must be able to control the gate voltage, independent of the level of the source.

FIG. 2 shows a power amplifier with a complementary MOS output stage consisting of a low-side driver for an N type output device and a high side driver for a P-type output device.

Figure 8:
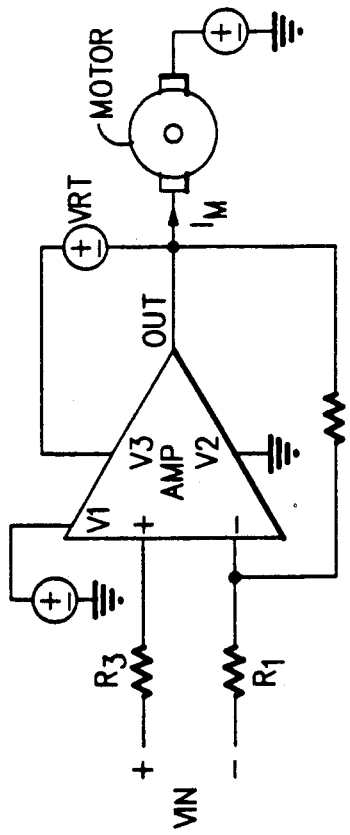
FIG. 8 is a diagrammatic illustration of a linear class B amplifier such as that of FIG. 1 or FIG. 2 in a closed loop mode with fixed voltage gain driving a motor.

The advantages of the inherent high gain and dominant pole obtained by using a transconductance amplifier when driving a MOS output stage are described in the above-identified co-pending patent application. A brief description is contained here. Driving the high impedance capacitive input of a large MOS device with a bidirectional current source produces an amplifier with high DC gain and an inherent dominant pole at zero hertz. The bandwidth and slew rate of the amplifier can be changed by adjusting the transconductance and maximum gate current, respectively, when using a large MOS device with known transconductance and gate capacitance. These parameters are controlled by the current IBIAS, the dimensions of the transistors, and the dimensions and transconductance of the power device. An amplifier such as that of FIG. 1 or FIG. 2, when combined with appropriate feedback resistance, can be used as a power voltage gain stage for driving motor loads as shown in FIG. 8.

An embodiment of the differential input complementary output transconductance amplifier G1 of FIG. 1 is shown in FIG. 3.

In this circuit, semiconductor devices are connected in standard differential (Q1 and Q2) and current mirror (Q3-Q18) structures to form an amplifier with a differential input stage, an in-phase bidirectional current output, and an out of phase bidirectional current output. Devices Q13-Q15, which form the last stages of the in-phase output GATEU, provide level translation allowing this output to float with the KU input, which is in turn connected to the source of the QA N-type MOS device in FIG. 1. VBT is an externally generated bias voltage which has a fixed potential relative to the KU input.

With different potentials on the + and − inputs, Q1 and Q2 form a differential current amplifier with an output I1 and I2. These imbalanced currents are mirrored (with additional gain provided by adjusting the mirror ratios if desired) then summed at GATEL and GATEU outputs. The result is a bidirectional output proportional to the difference in I1 and I2.

$$I(GATEU) = k(I1 - I2)$$
$$I(GATEL) = k(I2 - I1)$$

where k = gain of mirror ratios

An embodiment of the differential input dual output transconductance amplifier G1' of FIG. 2 is shown in FIG. 4. This type amplifier can be used when driving a complementary MOS. output stage. As with the previous circuit, semiconductor devices can be used in standard differential input (Q1,Q2) and current mirror (Q3-Q7) structures to form the differential input and bidirectional current outputs to drive the MOS output stage.

FIG. 5 shows an embodiment of the shoot-through protection circuit M1 of FIG. 1 for use with the gate driver G1 and the NMOS output devices, which will both prevent the transconductance gate driver from turning on both output devices during transition and keep other sources of current into the gate of the non-conducting device from turning on that device while the other is on. Other sources of these currents include current injection due to capacitive coupling of the gate to the output of the MOS devices during large voltage change on the output node.

The circuit shown in FIG. 5 prevents the condition where QA and QB are on at the same time by providing a low impedance path between the gate and source of either device if the gate to source voltage of the other device is above a reference voltage VT.

The circuit monitors the voltage on the line GATEL. Q7 and Q8 are matched and device Q7 is diode connected. If the voltage of GATEL is greater than VT, Q8 will be turned off. When the current Iu sunk by Q8 is less than I3, the node F potential rises, turning on the device Q4, which provides a means to inhibit the development of a potential from GATEU to KU which would have sufficient magnitude to turn on the MOS device QA in FIG. 1.

Alternately, if the potential from GATEU to KU is greater than VT, with Q3, Q1 matched devices, and Q3 diode connected as shown, then Q1 will turn off raising the potential on node C and turning off Q2. When the current sourced by Q2 is less than I6, the potential at node D is lowered turning off Q5 and raising the potential at node E turning on Q6. The turning on of Q6 provides the means to inhibit the development of sufficient potential on the line GATEL which would turn on the MOS device connected to GATEL (QB in FIG. 1). Thus, if either potential GATEL to VSS or GATEU to KU exceeds VT, the circuit of FIG. 5 prevents the other device from turning on by placing a low impedance from gate to source of the other device. If the potentials are less than VT, the devices (Q4 and Q6) are off providing a high impedance between these nodes.

Figure 6:
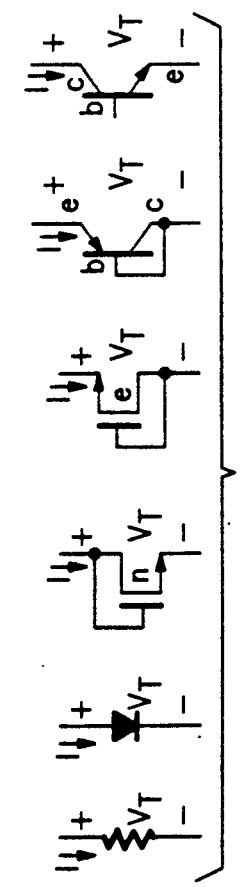
FIG. 6 is an illustration of several forms of threshold voltage reference circuits.

The development of the reference potential VT can be realized by the methods shown in FIG. 6. The method chosen should provide a reference which is less than the minimum turn on voltage (or threshold voltage) for the MOS transistor in the output stage.

The current sources I1-I6 can be built using standard current mirror structures, or properly sized resistor or semiconductor devices as pull-up or pull-down devices.

Figure 7:
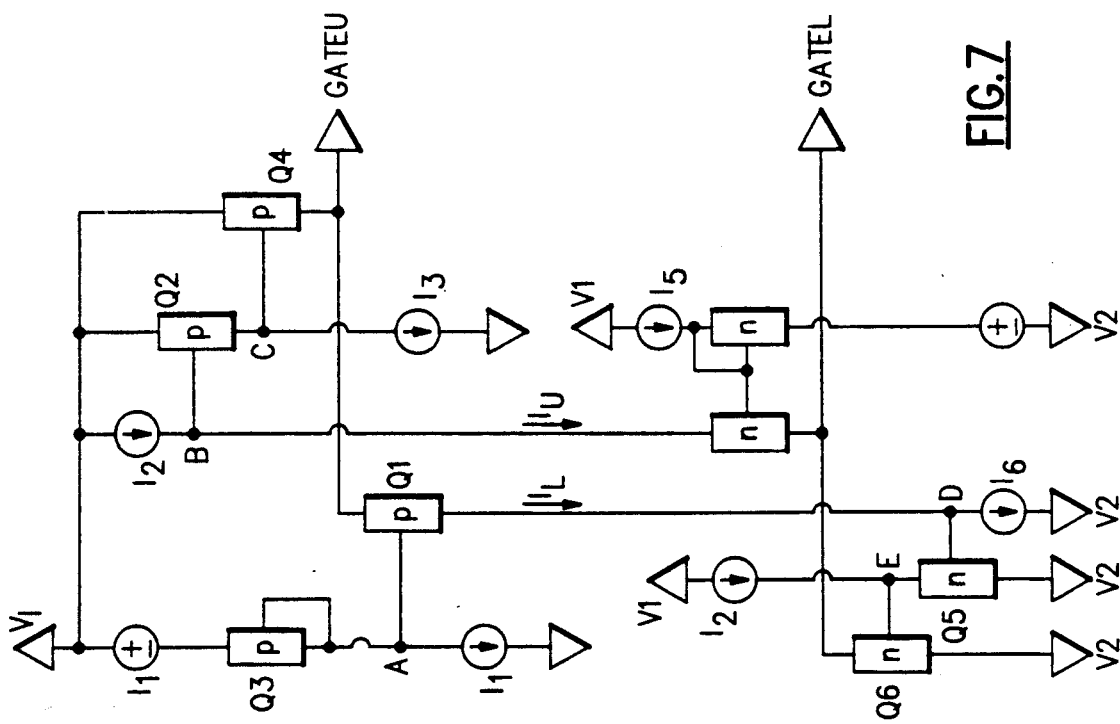
FIG. 7 is a schematic diagram of the shoot-through protection circuit of FIG. 2.

An embodiment of the shoot-through protection circuit M1, is shown in FIG. 7 for use with the complementary MOS output stage of FIG. 2. In this circuit, the devices associated with GATEL (Q5-Q8) serve the identical function as described in the previous circuit. The devices associated with GATEU are (Q1-Q4), and their interconnections have been changed to allow the circuit to function with a P-type MOS output device.

In this circuit, when Iu is less than I2 (caused by GATEL being greater than VT), the node B potential is raised turning off Q2. I3 then drops the potential on node C turning on Q4 which provides a means to prevent development of sufficient potential from VBT to GATEU for the MOS device attached to GATEU (QA' in FIG. 2) from turning on. Alternately, if the potential from V1 to GATEU is greater than VT, with Q3 and Q1 being matched devices and Q3 diode connected as shown, Q1 is off. When $I_L$, the current sourced by Q1, is lower than I6, the lower circuit inhibits the development of potential from GATEL to V2 in a means identical to the circuit of FIG. 5 previously described.

By connecting the amplifier of FIG. 1 as a differential amplifier, as shown, in FIG. 8 using a standard feedback resistor configuration, a fixed gain power voltage amplifier can be realized with controllable bandwidth and slew rate, differential voltage input and shoot-through protection. This amplifier can be used as a buffer for driving low impedance or high current inductive loads such as the motor of FIG. 8. A second differential amplifier can be used to drive the motor of FIG. 8 in an H-bridge configuration.

What is claimed is:

1. A linear power amplifier having shoot through protection comprising:
   a first field effect transistor and a second field effect transistor having conduction electrodes coupled in series with an output connected between the conduction electrodes of the first transistor and the second transistor which are coupled together, each transistor having a gate electrode;
   means for substantially alternately providing a gate drive signal to the gates of the first and second transistors to turn on the transistors alternately;
   means for producing a low impedance path from the gate of the first transistor to one of its conduction electrodes if the gate voltage at the second transistor is greater than a reference value; and
   means for producing a low impedance path from the gate of the second transistor to one of its conduction electrodes if the gate voltage at the first transistor is greater than a reference value.

2. The amplifier of claim 1 which comprises means for substantially alternately providing a gate drive signal to the gates of the first and second transistor in a manner resulting in a single pole roll-off of the amplifier gain.

* * * * *